US011259406B2

(12) United States Patent
Suzuki et al.

(10) Patent No.: US 11,259,406 B2
(45) Date of Patent: Feb. 22, 2022

(54) FLEXIBLE CONNECTOR FOR A DISPLAY DEVICE

(71) Applicant: SYNAPTICS INCORPORATED, San Jose, CA (US)

(72) Inventors: Shinya Suzuki, Tokyo (JP); Naoyuki Narita, Tokyo (JP); Tsuyoshi Koga, Tokyo (JP); Yuichi Nakagomi, Tokyo (JP)

(73) Assignee: Synaptics Incorporated, San Jose, CA (US)

( * ) Notice: Subject to any disclaimer, the term of this patent is extended or adjusted under 35 U.S.C. 154(b) by 20 days.

(21) Appl. No.: 16/689,805

(22) Filed: Nov. 20, 2019

(65) Prior Publication Data

US 2020/0163208 A1     May 21, 2020

Related U.S. Application Data

(60) Provisional application No. 62/770,231, filed on Nov. 21, 2018.

(51) Int. Cl.
| | | |
|---|---|---|
| *H05K 1/00* | (2006.01) | |
| *H05K 1/02* | (2006.01) | |
| *H05K 1/11* | (2006.01) | |
| *H05K 1/14* | (2006.01) | |
| *H05K 1/18* | (2006.01) | |
| *H05K 3/00* | (2006.01) | |
| *H05K 3/34* | (2006.01) | |
| *H05K 3/36* | (2006.01) | |
| *H01L 23/498* | (2006.01) | |
| *G06F 3/044* | (2006.01) | |
| *G06F 3/041* | (2006.01) | |

(52) U.S. Cl.
CPC ......... *H05K 1/0281* (2013.01); *G06F 3/0446* (2019.05); *H01L 23/4985* (2013.01); *H01L 23/49838* (2013.01); *H05K 1/189* (2013.01); *G06F 3/0412* (2013.01); *G06F 3/04166* (2019.05); *H05K 2201/10128* (2013.01)

(58) Field of Classification Search
CPC .. H05K 1/02; H05K 1/14; H05K 3/00; H05K 3/10; H05K 3/28; H05K 3/46; H01L 23/00; H01L 23/34; H01L 23/36; H01L 23/48; H01L 23/50; H01L 23/485; H01L 23/495; H01L 23/498; H01L 23/538; G06F 3/0412; G06F 3/04166; G06F 3/0446
USPC ......... 361/749; 174/254; 257/644, 737, 774, 257/778
See application file for complete search history.

(56) References Cited

U.S. PATENT DOCUMENTS 5,615,477 A * 4/1997 Sweitzer ............. H01L 23/4985
29/840
6,391,686 B1 * 5/2002 Shiozawa ............... H01L 24/32
257/E21.514

(Continued)

*Primary Examiner* — Xiaoliang Chen
(74) *Attorney, Agent, or Firm* — Ferguson Braswell Fraser Kubasta PC

(57) ABSTRACT

A flexible connector comprises a first plurality of pads disposed within an integrated circuit (IC) area, a second plurality of pads disposed in the IC area, and a plurality of through holes disposed in the IC area. The flexible connector further comprises first wiring coupled to the plurality of through holes and the first plurality of pads, and a rigidity element at least partially disposed between the plurality of through holes and the second plurality of pads.

20 Claims, 9 Drawing Sheets

(56) References Cited

U.S. PATENT DOCUMENTS

| | | | | |
|---|---|---|---|---|
| 6,566,763 B2* | 5/2003 | Shiozawa | H01L 24/32 | 257/782 |
| 7,420,270 B2* | 9/2008 | Lee | H01L 23/49838 | 257/691 |
| 7,880,286 B2* | 2/2011 | Lee | H01L 23/49838 | 257/691 |
| 8,275,223 B2* | 9/2012 | Wang | G02B 6/43 | 385/14 |
| 8,340,480 B2* | 12/2012 | Wang | G02B 6/43 | 385/14 |
| 9,484,286 B2* | 11/2016 | Suzuki | H01L 21/768 | |
| 9,484,287 B2* | 11/2016 | Suzuki | H01L 21/768 | |
| 9,508,630 B2* | 11/2016 | Suzuki | H01L 23/522 | |
| 2003/0197272 A1* | 10/2003 | Suzuki | H01L 24/05 | 257/750 |
| 2006/0103030 A1* | 5/2006 | Aoki | H01L 24/28 | 257/778 |
| 2006/0131064 A1* | 6/2006 | Hagiwara | H01L 23/4985 | 174/250 |
| 2007/0013056 A1* | 1/2007 | Lee | H01L 23/50 | 257/723 |
| 2008/0315437 A1* | 12/2008 | Lee | H01L 23/4985 | 257/778 |
| 2009/0096069 A1* | 4/2009 | Ishimaru | H01L 23/49838 | 257/666 |
| 2010/0078781 A1* | 4/2010 | Ganesan | H01L 23/49822 | 257/664 |
| 2011/0158273 A1* | 6/2011 | Okayama | H01L 24/97 | 372/43.01 |
| 2012/0132352 A1* | 5/2012 | Wang | G02B 6/43 | 156/247 |
| 2014/0131889 A1* | 5/2014 | Kim | H01L 23/552 | 257/774 |
| 2014/0167245 A1* | 6/2014 | Kim | H01L 23/4985 | 257/712 |
| 2014/0226106 A1* | 8/2014 | Sung Ki | G02B 6/0085 | 349/62 |
| 2014/0353819 A1* | 12/2014 | Chuang | H01L 21/76801 | 257/737 |
| 2016/0079202 A1* | 3/2016 | Suzuki | H01L 21/0217 | 257/72 |
| 2016/0086911 A1* | 3/2016 | Suzuki | G02F 1/13458 | 257/72 |
| 2018/0063962 A1* | 3/2018 | Lee | H05K 1/118 | |
| 2019/0189551 A1* | 6/2019 | Ha | H01L 23/3185 | |
| 2020/0243452 A1* | 7/2020 | Lim | H01L 23/5386 | |
| 2021/0045229 A1* | 2/2021 | Lim | H01L 23/495 | |

* cited by examiner

FLEXIBLE CONNECTOR FOR A DISPLAY DEVICE

CROSS-REFERENCE TO RELATED APPLICATIONS

This application claims priority to U.S. provisional patent application Ser. No. 62/770,231, filed Nov. 21, 2018, which is incorporated by reference herein in its entirety.

BACKGROUND

Field

Embodiments disclosed herein generally relate to flexible connectors for display devices.

Description of the Related Art

In many conventional electronic devices, integrated circuit (IC) chips are disposed on a substrate of the electronic device. However, such an arrangement requires that a portion of the substrate be reserved for the IC chip, either increasing the size of the substrate or limiting the amount of the substrate area that may be utilized for electronic components of the electronic devices. In order to increase the area of the substrate that may be utilized for electrical components, the IC chips have been moved off of the substrate, and, instead, disposed on a flexible connector coupled to the substrate.

Typically, the flexible connector connects an electronic device with a host processing device and provides a communication pathway for data to be communicated between the IC chip and the host processing device. FIG. 1 is a top lead view of a conventional flexible connector 100. In the embodiment of FIG. 1, the flexible connector is a 2L-COF (2-Layer Chip on Film).

In many instances, mounting an IC chip (e.g., IC chip 210 of FIG. 2) to the flexible connector 100 during assembly includes crimping the flexible connector 100 to the IC chip within the IC area 110. However, the force exerted onto the flexible connector may cause one or layers within the flexible connector 100 to warp (e.g., bend or curve) toward the IC chip within the IC area 110, resulting in one or more failures of the mounting process. For example, as shown in FIG. 2, the tape layer 212 of the flexible connector 100 may warp during the crimping process, cracking the passivation layer on the IC chip 210 and/or causing a short circuit within the leads 230 of the flexible connector due to foreign matter trapped between the IC chip 210 and the flexible connector 100.

Thus, there is a need for an improved flexible connector that is free of warping during the crimping process.

SUMMARY

In one embodiment, a flexible connector comprises a first plurality of pads disposed within an integrated circuit (IC) area, a second plurality of pads disposed in the IC area, and a plurality of through holes disposed in the IC area. The flexible connector further comprises first wiring coupled to the plurality of through holes and the first plurality of pads, and a rigidity element at least partially disposed between the plurality of through holes and the second plurality of pads.

In one embodiment, a display device comprises a substrate, a plurality of display electrodes disposed on the substrate, a flexible connector connected to the substrate and an IC chip. The flexible connector comprises a first plurality of pads disposed within an IC area of the flexible connector, a second plurality of pads disposed in the IC area, and a plurality of through holes disposed in the IC area. The flexible connector further comprises first wiring coupled to the plurality of through holes and the first plurality of pads, and a rigidity element at least partially disposed between the plurality of through holes and the second plurality of pads. The IC chip is coupled to the plurality of through holes within the IC area. The IC chip is configured to drive the plurality of display electrodes to update a display of the display device.

In one embodiment, an input device comprises a flexible connector and an IC chip. The flexible connector comprises a first plurality of pads disposed within an IC area of the flexible connector, a second plurality of pads disposed in the IC area, and a plurality of through holes disposed in the IC area. The flexible connector further comprises first wiring coupled to the plurality of through holes and the first plurality of pads, and a rigidity element at least partially disposed between the plurality of through holes and the second plurality of pads. The IC chip is coupled to the through holes of the flexible connector within the IC area.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

Figure 1:
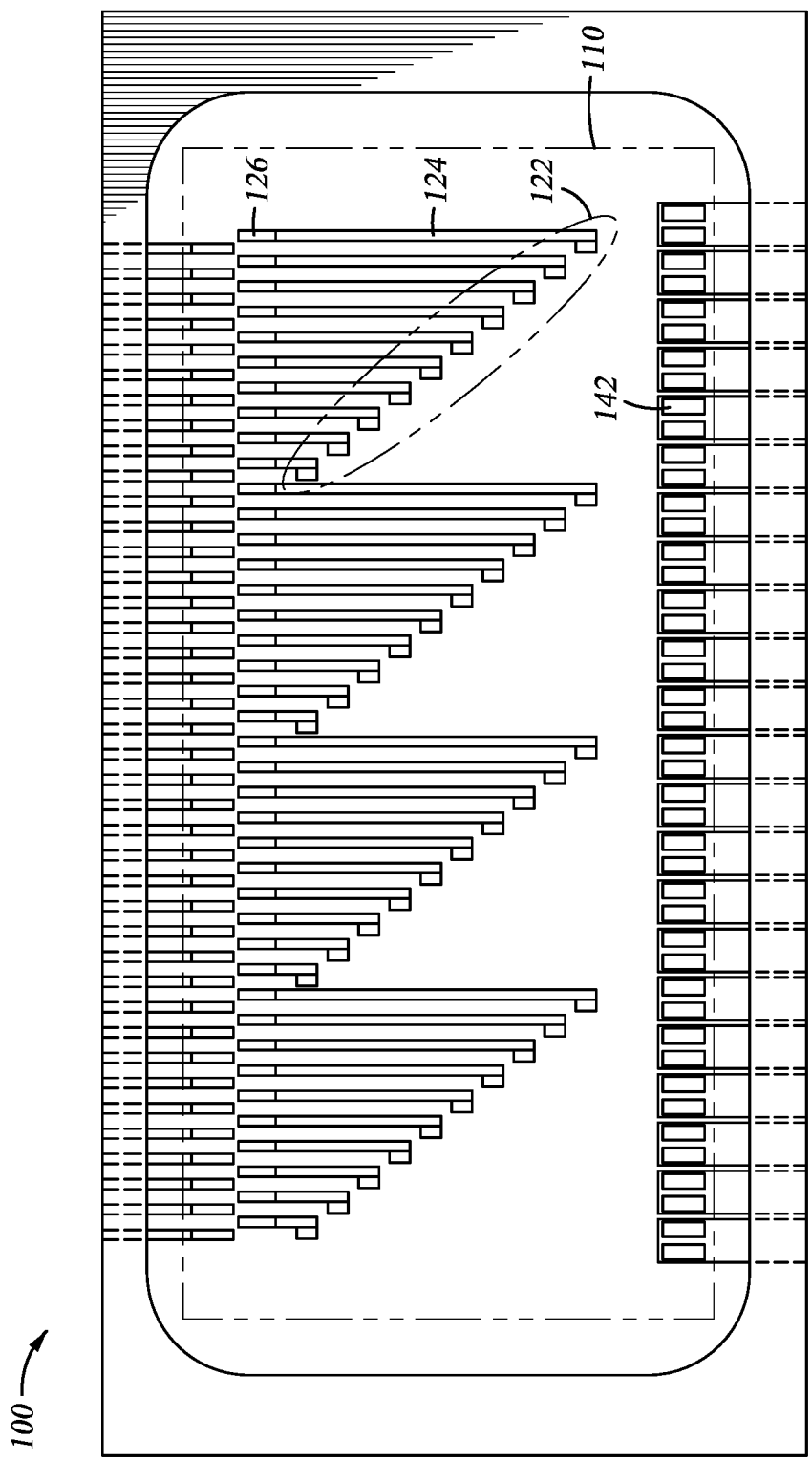
FIG. 1 illustrates a portion of a conventional flexible connector.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

Figure 3:
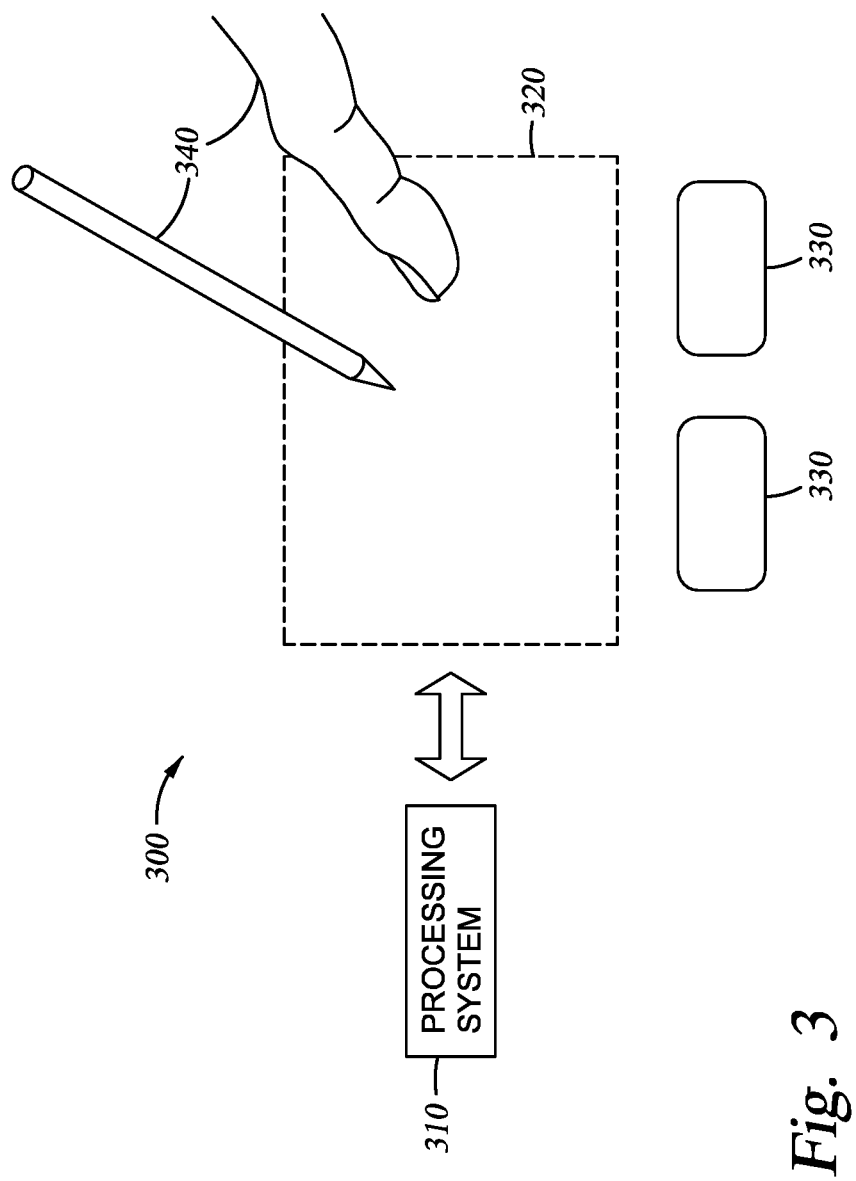
FIG. 3 is a schematic block diagram of an input device, according to one or more embodiments.

An example input device 300, as shown in FIG. 3 in accordance with embodiments of the disclosure, may be configured to provide input to an electronic system (not shown). As used in this document, the term "electronic system" broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 300 and separate joysticks or key switches. Further example electronic systems include peripherals such as data input devices, e.g., remote controllers and mice, and data output devices, e.g., display screens and printers. Other examples include remote terminals, kiosks, and video game machines, e.g., video game consoles, portable gaming devices, and the like. Other examples include communication devices, e.g., cellular phones such as smart phones, and media devices, e.g., recorders, editors, and players such as televisions, set-top boxes, music players, digital photo frames, and digital cameras. Additionally, the electronic system could be a host or a slave to the input device. The electronic system may also be referred to as electronic device.

The input device 300 can be implemented as a physical part of the electronic system, or can be physically separate from the electronic system. In one embodiment, the electronic system may be referred to as a host device. As appropriate, the input device 300 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 3, the input device 300 is shown as a proximity sensor device configured to sense input provided by one or more input objects 340 in a sensing region 320. Example input objects 340 include fingers and styli, as shown in FIG. 3. An exemplary proximity sensor device may be a touchpad, a touch screen, a touch sensor device and the like.

The sensing region 320 encompasses any space above, around, in and/or near the input device 300 in which the input device 300 is able to detect user input, e.g., user input provided by one or more input objects 340. The sizes, shapes, and locations of particular sensing regions may vary widely from embodiment to embodiment. In some embodiments, the sensing region 320 extends from a surface of the input device 300 in one or more directions into space until signal-to-noise ratios prevent sufficiently accurate object detection. The distance to which this sensing region 320 extends in a particular direction, in various embodiments, may be on the order of less than a millimeter, millimeters, centimeters, or more, and may vary significantly with the type of sensing technology used and the accuracy desired. Thus, some embodiment's sense input that comprises: no contact with any surfaces of the input device 300; contact with an input surface, e.g., a touch surface, of the input device 300: contact with an input surface of the input device 300 coupled with some amount of applied force or pressure; and/or a combination thereof. In various embodiments, input surfaces may be provided by surfaces of casings within which the sensor electrodes (also referred to herein as sensing electrodes) reside, by face sheets applied over the sensor electrodes or any casings, etc. In some embodiments, the sensing region 320 has a rectangular shape when projected onto an input surface of the input device 300.

The input device 300 may utilize any combination of sensor components and sensing technologies to detect user input in the sensing region 320. The input device 300 comprises one or more sensing elements for detecting user input. As several non-limiting examples, the input device 300 may use capacitive, elastive, resistive, inductive, magnetic, acoustic, ultrasonic, and/or optical techniques.

Some implementations are configured to provide images (e.g., of capacitive signals) that span one, two, three, or higher dimensional spaces. Some implementations are configured to provide projections of input along particular axes or planes.

In some capacitive implementations of the input device 300, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self-capacitance" (also often referred to as "absolute capacitance") sensing methods based on changes in the capacitive coupling between sensor electrodes and an input object (e.g., between a system ground and freespace coupling to the user). In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage, e.g., system ground, and by detecting the capacitive coupling between the sensor electrodes and input objects. In some implementations sensing elements may be formed of a substantially transparent metal mesh (e.g., a reflective or absorbing metallic film patterned to minimize visible transmission loss from the display subpixels). Further, the sensor electrodes may be disposed over a display of a display device. The sensing electrodes may be formed on a common substrate of a display device (e.g., on the encapsulation layer of a rigid or flexible organic light emitting diode (OLED) display). An additional dielectric layer with vias for a jumper layer may also be formed of a substantially transparent metal mesh material (e.g., between the user input and the cathode electrode). Alternately, the sensor may be patterned on a single layer of metal mesh over the display active area with cross-overs outside of the active area. The jumpers of the jumper layer may be coupled to the electrodes of a first group and cross over sensor electrodes of a second group. In one or more embodiments, the first and second groups may be orthogonal axes to each other. Further, in various embodiments, the absolute capacitance measurement may comprise a profile of the input object couplings accumulated along one axis and projected onto the other. In various embodiments, a modulated an input object (e.g., a powered active stylus) may be received by the orthogonal electrode axes without modulation of the corresponding electrodes (e.g., relative to a system ground). In such an embodiment, both axes may be sensed simultaneously and combined to estimate stylus position.

Some capacitive implementations utilize "mutual capacitance" (also often referred to as "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also referred to herein as "transmitter electrodes" or "transmitters") and one or more receiver sensor electrodes (also referred to herein as "receiver electrodes" or "receivers"). The coupling may be reduced when an input object coupled to a system ground approaches the sensor electrodes. Transmitter sensor electrodes may be modulated relative to a reference voltage, e.g., system ground, to transmit transmitter signals. Receiver sensor electrodes may be held substantially constant relative to the reference voltage or modulated relative to the transmitter sensor electrodes to facilitate receipt of resulting signals. A resulting signal may comprise effect(s) corresponding to one or more transmitter signals, and/or to one or more sources of environmental interference, e.g., other electromagnetic signals. Sensor electrodes may be dedicated transmitters or receivers, or may be configured to both transmit and receive.

Figure 4:
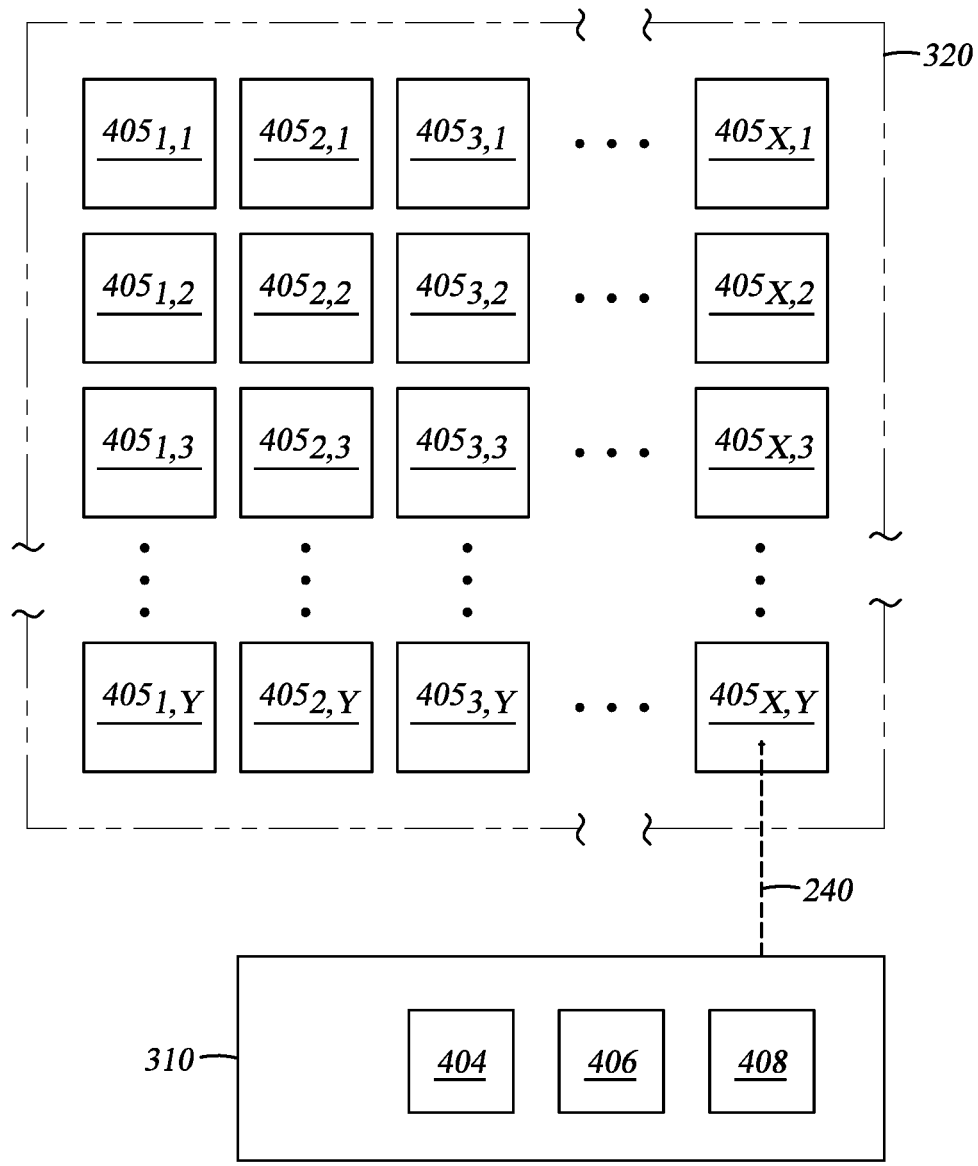
FIGS. 4 and 5 illustrate example input devices, according to one or more embodiments.

FIG. 4 shows a portion of an exemplary pattern of sensor electrodes 405 configured to sense in the sensing region 320 associated with a pattern, according to some embodiments. Each sensor electrode 405 may include one of more of the sensing elements described above. For clarity of illustration and description, FIG. 4 presents the regions of the sensor electrodes 405 in a pattern of simple rectangles and does not show various other components connected to or within the sensor electrodes 405. In one embodiment, the sensor electrodes 405 forms areas of localized capacitance of corresponding capacitive sensing pixels, or capacitive pixels. Capacitive sensing pixels may be formed between an individual sensor electrode 405 and ground when the sensor electrodes 405 are operated for absolute capacitive sensing. Further, the capacitive sensing pixels may be formed between groups of sensor electrodes 405 used as transmitter and receiver electrodes when the sensor electrodes 405 are operated for transcapacitive sensing. The capacitance between the sensor electrodes 405 and ground and/or between the sensor electrodes 405 changes with the proximity and motion of input objects in the sensing region 320, and thus may be used as an indicator of the presence of the input object 340 in the sensing region 320 and to determine positional information of an input object 340.

The exemplary pattern comprises an array of sensor electrodes $405_{X, Y}$ (referred collectively as sensor electrodes 405) arranged in X columns and Y rows in a common plane, wherein X and Y are positive integers, although one of X and Y may be zero. It is contemplated that the pattern of sensor electrodes 405 may comprise a plurality of sensor electrodes 405 having other configurations, such as polar arrays, repeating patterns, non-repeating patterns, non-uniform arrays a single row or column, or other suitable arrangement. Further, as will be discussed in more detail below, the sensor electrodes 405 may be any shape such as circular, rectangular, diamond, star, square, noncovex, convex, nonconcave concave, etc. As shown here, the sensor electrodes 405 are coupled to the processing system 310 and utilized to determine the presence of (or lack thereof) and positional information an input object, e.g., the input object 340, in the sensing region 320.

The sensor electrodes 405 are ohmically isolated from each other. That is, one or more insulators separate the sensor electrodes 405 and prevent them from electrically shorting to each other.

In a first mode of operation, at least one sensor electrode 405 may be utilized to detect the presence of the input object 340 and positional information of the input object 340 via absolute sensing techniques. A sensor module 404 in the processing system 310 is configured to drive the sensor electrodes 405 using traces 240 with an absolute capacitive sensing signal and acquire resulting signals from the sensor electrodes 405 to perform absolute capacitive sensing. Further, a determination module 406 may receive the resulting signals from the sensor module 404 to determine changes in absolute capacitive coupling for the sensor electrodes 405. Further, the determination module 406 determines positional information of the input object 340 based on the changes in absolute capacitive sensing.

In a second mode of operation, sensor electrodes 405 are utilized to detect the presence of the input object 340 via transcapacitance sensing techniques. That is, the sensor module 404 may drive a first at least one sensor electrode 405 with a transcapacitive sensing signal and receive resulting signals using a second at least one sensor electrode 405. The resulting signals comprising effects corresponding to the transcapacitive sensing signal. The resulting signals are provided to the determination module 406 from the sensor module 404 to determine changes in transcapacitive coupling for the sensor electrodes 405. Further, the determination module 406 determines positional information of the input object 340 based on the transcapacitive coupling. The sensor electrodes that are driven with the transcapacitive signal are modulated relative to the sensor electrodes that receive the resulting signals. In one embodiment, both the sensor electrodes that are driven with the transmitter signal and the sensor electrodes that receive the resulting signals are modulated. Further, in another embodiment, the receiver electrodes are driven with a constant voltage signal while the transmitter electrodes driven with the transcapacitive sensing signal are modulated.

The input device 300 may be configured to operate in either of the modes described above. The input device 300 may also be configured to switch between the two modes described above.

In some embodiments, the sensor electrodes 405 are "scanned" to acquire the resulting signals. That is, in one embodiment, one or more of the sensor electrodes 405 are driven with transcapacitive sensing signals. One sensor electrode 405 may be driven with at a transcapacitive sensing signal at one time. Alternatively, multiple sensor electrodes 405 are driven with transcapacitive sensing signals at the same time. In such an embodiment, the sensor electrodes 405 are driven with the transcapacitive sensing signals simultaneously. Two or more of the sensor electrodes 405 may be driven with the same transcapacitive sensing signal. In such an embodiment, driving two more of the sensor electrodes 405 effectively produces an effectively larger sensor electrode. Alternatively, a first one or more of the sensor electrodes 405 may be driven with a first transcapacitive sensing signal and a second one or more of the sensor electrodes may be driven with a second transcapacitive sensing signal. The first and second transcapacitive sensing signals are different. Further, the first and second transcapacitive sensing signals may be based on different ones of a plurality of digital codes that enable the combined effects on the resulting signals of receiver electrodes to be independently determined.

The sensor electrodes configured as receiver sensor electrodes may be operated singly or multiply to acquire resulting signals. The resulting signals may be used to determine measurements of the capacitive couplings of the sensor electrodes 405.

In other embodiments, "scanning" the sensor electrodes 405 includes driving with an absolute capacitive sensing signal and measuring the absolute capacitance of one or more of the sensor electrodes 405. The absolute capacitive sensing may be driven on one or more of the sensor electrodes 405 at the same time. In such embodiments, an absolute capacitive measurement may be obtained from each of the driven sensor electrodes 405 simultaneously. In one embodiment, a first one or more of the sensor electrodes 405 may be driven with absolute capacitive sensing signals during a first period and a second one or more of the sensor electrodes may be driven with absolute capacitive sensing signals during a second period. The first period and the second period may be at least partially overlapping or non-overlapping. In another embodiment, each of the sensor electrodes 405 may be simultaneously driven during the same period.

In various embodiments, processing system 310 may be configured to selectively drive and receive with a portion of sensor electrodes. For example, the sensor electrodes utilized to perform absolute capacitive sensing and/or transcapacitive sensing may be selected based on, but not limited to, an application running on the host processor, a status of the input device, an operating mode of the sensing device and a determined location of an input device. The host processor may be central processing unit or any other processor of an electronic device.

A set of measurements determined from the resulting signals received from the sensor electrodes 405 may be utilized by the determination module 406 to form a capacitive image. Further, the resulting signals may be received during a capacitive frame. A capacitive frame may correspond to one or more capacitive images. Multiple capacitive images may be acquired over multiple time periods, and differences between them used to derive information about an input device in the sensing region 320. For example, successive capacitive images acquired over successive periods of time can be used to track the motion(s) of one or more input objects entering, exiting, and within the sensing region.

In some embodiments, one or more of the sensor electrodes 405 include one or more display electrodes used in updating the display of the display screen. In one or more embodiment, the display electrodes comprise one or more segments of a common voltage electrode, also referred to as a Vcom electrode, a source electrode, gate electrode, an anode electrode or cathode electrode, among others. These display electrodes may be disposed on an appropriate display screen substrate. For example, in display screens such as In Plane Switching (IPS) and Plane to Line Switching (PLS) Organic Light Emitting Diode (OLED), the display electrodes may be disposed on a transparent substrate, e.g., a glass substrate, TFT glass, or any other transparent material). In other embodiments, in display screens such as Patterned Vertical Alignment (PVA) and Multi-domain Vertical Alignment (MVA), the display electrodes may be disposed on the bottom of a color filter glass. In such embodiments, an electrode that is used as both a sensor electrode and a display electrode can also be referred to as a combination electrode, since it performs multiple functions.

Continuing to refer to FIG. 4, in various embodiments, the processing system 310 coupled to the sensing electrodes 405 includes the sensor module 404 and the determination module 406. Further, the processing system 310 may additionally include a display driver 408. In one embodiment, the sensor module 404 comprises circuitry configured to drive the transcapacitive sensing signals and the absolute capacitive sensing signal onto the sensor electrodes 405 and receive resulting signals with the sensor electrode 405 during periods in which input sensing is desired.

The sensor module 404 comprises a transmitter circuitry configured to drive a transcapacitive sensing signal and/or an absolute capacitive sensing signal onto the sensor electrodes 405 during periods in which input sensing is desired. The transcapacitive sensing signal and the absolute capacitive sensing signal is modulated and contains one or more sensing bursts in one or more sensing cycles over a period of time allocated for input sensing. The transcapacitive sensing signal and an absolute capacitive sensing signal may have an amplitude, frequency and voltage. Further, the transcapacitive sensing signal and an absolute capacitive sensing signal are varying voltage signals that modulate between two or more voltages. The absolute capacitive sensing signal may be the same or different from the transcapacitive sensing signal used in transcapacitance sensing. The sensor module 404 may be selectively coupled to one or more of the sensor electrodes 405. For example, the sensor module 404 may be coupled to selected portions of the sensor electrodes 405 and operate in either an absolute or transcapacitance sensing mode. In another example, the sensor module 404 may be coupled to different sensor electrodes when operating in the absolute sensing mode than when operating in the transcapacitance sensing mode.

In various embodiments, the sensor module 404 comprises receiver circuitry configured to receive a resulting signal with the sensing electrodes comprising effects corresponding to the transmitter signal during periods in which input sensing is desired. In one or more embodiments, the sensor module 404 is configured to receive a resulting signal from a sensor electrode that is driven with an absolute capacitive sensing signal to determine changes in absolute capacitance between the sensor electrode and an input object. In one or more embodiments, the sensor module 404 determines a position of the input object in the sensing region 320. In one or more embodiments, the sensor module 404 provides a signal including information indicative of the resulting signal to another module or processor such as a determination module of the processing system 310 or a processor of the electronic device, e.g., a host processor, for determining the positional information of the input object 340 in the sensing region 320. In one or more embodiments, the sensor module comprises a plurality of receivers, where each receiver may be an analog front ends (AFEs).

The display driver 408 includes display driver circuitry configured to drive display electrodes to update a display. For example, the display driver 408 may drive display update signals on the display electrodes during non-sensing periods, e.g., display updating periods. The display driver 408 may include source driver circuitry configured to drive source electrodes of a display device for display updating. The display driver 408 may be included with or separate from the sensor module 404. In one embodiment, the processing system comprises a first integrated controller comprising the display driver 408 and at least a portion of the sensor module 404. In another embodiment, the processing system 310 comprises a first integrated controller comprising the display driver 408 and a second integrated controller comprising at least a portion of the sensor module 404.

In one or more embodiments, capacitive sensing or input sensing and display updating may occur during at least partially overlapping periods. For example, as a display electrode is driven for display updating, the display electrode may also be driven for capacitive sensing. Overlapping capacitive sensing and display updating may include modulating the reference voltage(s) of the display device and/or modulating at least one display electrode for a display in a time period that at least partially overlaps with when the sensor electrodes are configured for capacitive sensing. In another embodiment, capacitive sensing and display updating may occur during non-overlapping periods, also referred to as non-display update periods. In various embodiments, the non-display update periods may occur between display line update periods for two display lines of a display frame and may be at least as long in time as the display update period. In such embodiment, the non-display update period may be referred to as a long horizontal blanking period, long h-blanking period or a distributed blanking period. In other embodiments, the non-display update period may comprise horizontal blanking periods and vertical blanking periods. Processing system 310 may be configured to drive sensor electrodes for capacitive sensing during any one or more of or any combination of the different non-display update times.

In FIG. 3, a processing system 310 is shown as part of the input device 300. The processing system 310 is configured to operate the hardware of the input device 300 to detect input in the sensing region 320. The processing system 310 comprises parts of or all of one or more IC chips and/or other circuitry components. For example, a processing system, e.g., the processing system 310, for a mutual capacitance sensor device may comprise transmitter circuitry configured to transmit signals with transmitter sensor electrodes, and/or receiver circuitry configured to receive signals with receiver sensor electrodes. In some embodiments, the processing system 310 also comprises electronically-readable instructions, such as firmware code, software code, and/or the like. In some embodiments, components composing the processing system 310 are located together, such as near sensing element(s) of the input device 300. In other embodiments, components of processing system 310 are physically separate with one or more components close to sensing element(s) of input device 300, and one or more components elsewhere. For example, the input device 300 may be a peripheral coupled to a desktop computer, and the processing system 310 may comprise software configured to run on a central processing unit of the desktop computer and one or more ICs (in another embodiment, with associated firmware) separate from the central processing unit. As another example, the input device 300 may be physically integrated in a phone, and the processing system 310 may comprise circuits and firmware that are part of a main processor (e.g., a mobile device application processor or any other central processing unit) of the phone. In some embodiments, the processing system 310 is dedicated to implementing the input device 300. In other embodiments, the processing system 310 also performs other user input functions, such as operating display screens, measuring input forces, measuring tactile switch state, driving haptic actuators, etc.

The processing system 310 may be implemented as a set of modules that handle different functions of the processing system 310. Each module may comprise circuitry that is a part of the processing system 310, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 310 responds to user input (or lack of user input) in the sensing region 320 directly by causing one or more actions. Example actions include changing operation modes, as well as GUI actions such as cursor movement, selection, menu navigation, and other functions. In some embodiments, the processing system 310 provides information about the input (or lack of input) to some part of the electronic system, e.g., to a central processing system of the electronic system that is separate from the processing system 310, if such a separate central processing system exists. In some embodiments, some part of the electronic system processes information received from the processing system 310 to act on user input, such as to facilitate a full range of actions, including mode changing actions and GUI actions.

For example, in some embodiments, the processing system 310 operates the sensing element(s) of the input device 300 to produce electrical signals indicative of input (or lack of input) in the sensing region 320. The processing system 310 may perform any appropriate amount of processing on the electrical signals in producing the information provided to the electronic system. For example, the processing system 310 may digitize analog electrical signals obtained from the sensor electrodes. As another example, the processing system 310 may perform filtering or other signal conditioning. The filtering may comprise one or more of demodulating, sampling, weighting, and accumulating of analog or digitally converted signals (e.g., for FIR digital or IIR switched capacitor filtering) at appropriate sensing times. The sensing times may be relative to the display output periods (e.g., display line update periods or blanking periods). As yet another example, the processing system 310 may subtract or otherwise account for a baseline, such that the information reflects a difference between the electrical signals from user input and the baseline signals. A baseline may account for display update signals (e.g., subpixel data signal, gate select and deselect signal, or emission control signal) which are spatially filtered (e.g., demodulated and accumulated) and removed from the lower spatial frequency sensing baseline. Further, a baseline may compensate for a capacitive coupling between the sensor electrodes and one or more nearby electrodes. The nearby electrodes may be display electrodes, unused sensor electrodes, and or any proximate conductive object. Additionally, the baseline may be compensated for using digital or analog means. As yet further examples, the processing system 310 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional"

positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 300 is implemented with additional input components that are operated by the processing system 310 or by some other processing system. These additional input components may provide redundant functionality for input in the sensing region 320, or some other functionality. FIG. 1 shows buttons 330 near the sensing region 320 that can be used to facilitate selection of items using the input device 300. Other types of additional input components include sliders, balls, wheels, switches, and the like. Conversely, in some embodiments, the input device 300 may be implemented with no other input components.

In some embodiments, the input device 300 comprises a touch screen interface, and the sensing region 320 overlaps at least part of a display screen. For example, the sensing region 320 may overlap at least a portion of an active area of a display screen (or display panel). The active area of the display panel may correspond to a portion of the display panel where images are updated. In one or more embodiments, the input device 300 may comprise substantially transparent sensor electrodes (e.g., ITO, metal mesh, etc.) overlaying the display screen and provide a touch screen interface for the associated electronic system. The display panel may be any type of dynamic display capable of displaying a visual interface to a user, and may include any type of light emitting diode (LED), OLED, cathode ray tube (CRT), liquid crystal display (LCD), plasma, electroluminescence (EL), or other display technology. The input device 300 and the display panel may share physical elements. For example, some embodiments may utilize some of the same electrical components for displaying and sensing. As another example, the display panel may be operated in part or in total by the processing system 310.

A cathode electrode of an OLED display may provide a low impedance screen between one or more display electrodes and the sensor electrodes which may be separated by a thin encapsulation layer. For example, the encapsulation layer may be about 10 μm. Alternatively, the encapsulation layer may be less than 10 μm or greater than 10 μm. Further, the encapsulation layer may be comprised of a pin hole free stack of conformal organic and inorganic dielectric layers.

It should be understood that while many embodiments of the disclosure are described in the context of a fully functioning apparatus, the mechanisms of the present disclosure are capable of being distributed as a program product, e.g., software, in a variety of forms. For example, the mechanisms of the present disclosure may be implemented and distributed as a software program on information bearing media that are readable by electronic processors, e.g., non-transitory computer-readable and/or recordable/writable information bearing media readable by the processing system 310. Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 5:
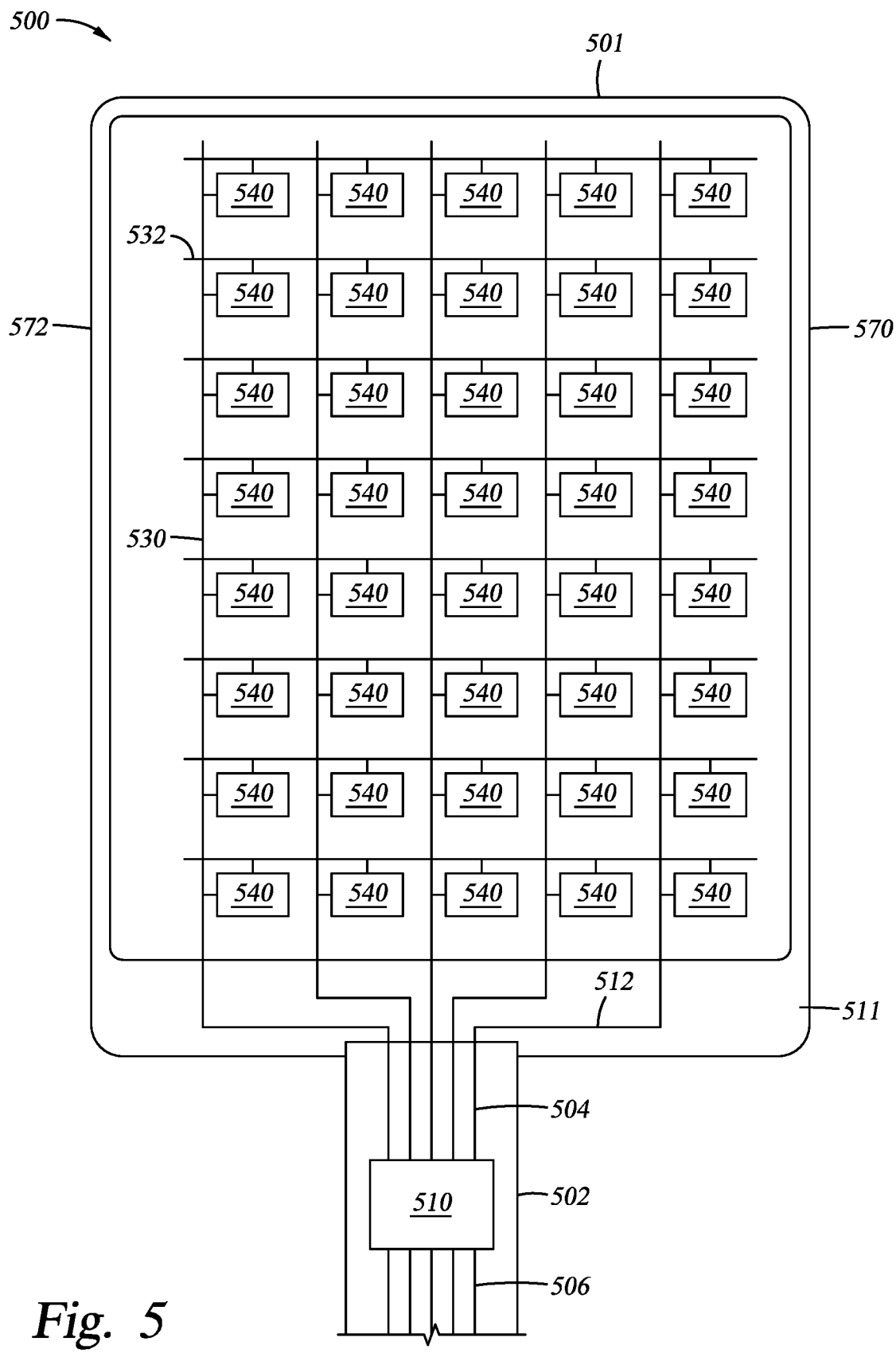

FIG. 5 illustrates an example input device 500, according to one or more embodiments. The input device 500 comprises a display device 501, flexible connector 502, and IC chip 510. The display device 501 is coupled to the flexible connector 502. In various embodiments, the input device 500 may include one or more sensor electrodes (e.g., the sensor electrodes 405). Further, the IC chip 510 is mounted to the flexible connector 502. The flexible connector 502 may be constructed as described with regard to flexible connectors 600 and 800 of FIG. 6 and FIG. 8, respectively. For example, the flexible connector 502 may be comprised of one or more flexible film layers. In one embodiment, the flexible connector 502 may include two or more layers of flexible film. Further, the IC chip 510 may be mounted to the flexible connector 502 as is described in FIG. 6 or FIG. 8. The IC chip 510 may be configured similar to that of the processing system 310. For example, the IC chip 510 may include any one or more of the sensor module 404, the determination module 406, and the display driver 408. In various embodiments, the IC chip 510 may be any one of a display driver IC (DDIC) chip, a touch display driver integration (TDDI) chip, and another application specific IC (ASIC) chip. A DDIC chip may be configured to drive a display device for updating. Further, a TDDI chip may be configured to drive a display device for updating and operate a sensing device to detect input objects (e.g., operate the sensor electrodes 405 for capacitive sensing). In one or more embodiments, the IC chip 510 may be a sensor IC chip configured to operate a sensing device to detect input objects. For example, the IC chip 510 may drive the sensor electrodes 405 for capacitive sensing.

The display device 501 includes a substrate 511, source electrodes (e.g., source lines or data lines) 530, gate electrodes (e.g., gate lines) 532, and subpixels 540. Each of the subpixels 540 is coupled to a respective one of the source electrodes 530 and the gate electrodes 532 via subpixel circuitry. The subpixel circuitry includes one or more transistors configured to couple and decouple each of the subpixels 540 to a respective one of the gate electrodes 532. The gate electrodes 532 are driven with gate select and deselect signals to activate and deactivate corresponding subpixels 540. The gate electrodes 532 are driven by gate select circuitry which is configured to drive gate electrodes 532 with select and deselect signals based on one or more clock signals. Further, the source electrodes 530 are driven with subpixel data signals by the IC chip 510 to update selected ones of the subpixels 540.

In one embodiment, the display device 501 is an OLED display device and the subpixels 540 are OLED subpixels. In such an embodiment, the display device 501 includes one or more cathode electrodes. Further, each of the subpixels 540 includes a respective anode electrode separated from the cathode electrode by one or more organic layers. Controlling the current driven on the anode electrode controls the brightness of each subpixel 540. In another embodiment, the display device 501 is an LCD device and the subpixels 540 are LCD subpixels. In such an embodiment, the display device 501 includes one or more Vcom electrodes. Further, each of the subpixels 540 includes a respective subpixel electrode separated from the Vcom electrode by a liquid crystal material. Controlling the voltage driven on the subpixel electrode controls the brightness of each subpixel 540.

The IC chip 510 is coupled to source electrodes 530 of the input device 500 via traces 504. In one embodiment, the traces 504 are disposed on the flexible connector 502. The flexible connector 502 is coupled to substrate 511 of the input device 500. Further, the traces 504 are coupled to traces 512 disposed on the substrate 511 such that display update signals output by the IC chip 510 may be coupled to the source electrodes 530 to update the subpixels 540. In one or more embodiments, the IC chip 510 is further coupled to sensor electrodes (e.g., the sensor electrodes 405) via one or more of the traces 504. In such embodiments, capacitive sensing signals may be communicated from the IC chip 510 to sensor electrodes (e.g., the sensor electrodes 405) and resulting signals may be communicated from the sensor electrodes to the IC chip 510 to operate the sensor electrodes for capacitive sensing.

In various embodiments, the number of traces 504 and 512 may differ from what is illustrated in the embodiment of FIG. 5. For example, traces 504 and 512 may include hundreds or thousands of traces. In one or more embodiments, the number of traces 504 and/or the number of traces 512 is at least equal to the number of source electrodes 530.

The flexible connector 502 further includes traces 506 which couple the IC chip 510 to a host device. In various embodiments, the number of traces 506 may include 10 or more traces. In other embodiments, the number of traces 506 may alternatively be less than 10 traces.

As illustrated in the embodiment of FIG. 5, the IC chip 510 is mounted to the flexible connector 502 instead of the substrate 511. In such embodiments, the active area (e.g., an area where image data is updated) of a display device 501 may be increased as compared to the overall size of the display device 501. Accordingly, the size of border regions 570, 572 of the display device 501 are decreased. Such display devices may be referred to edge to edge display devices. Further, the embodiments of FIGS. 6, 7, 8 and 9 disclose techniques for mounting an IC chip to a flexible connector that mitigate defects that may occur during the mounting process. Accordingly, the failure of a final assembled device (e.g., the input device 500) is decreased.

Figure 6:
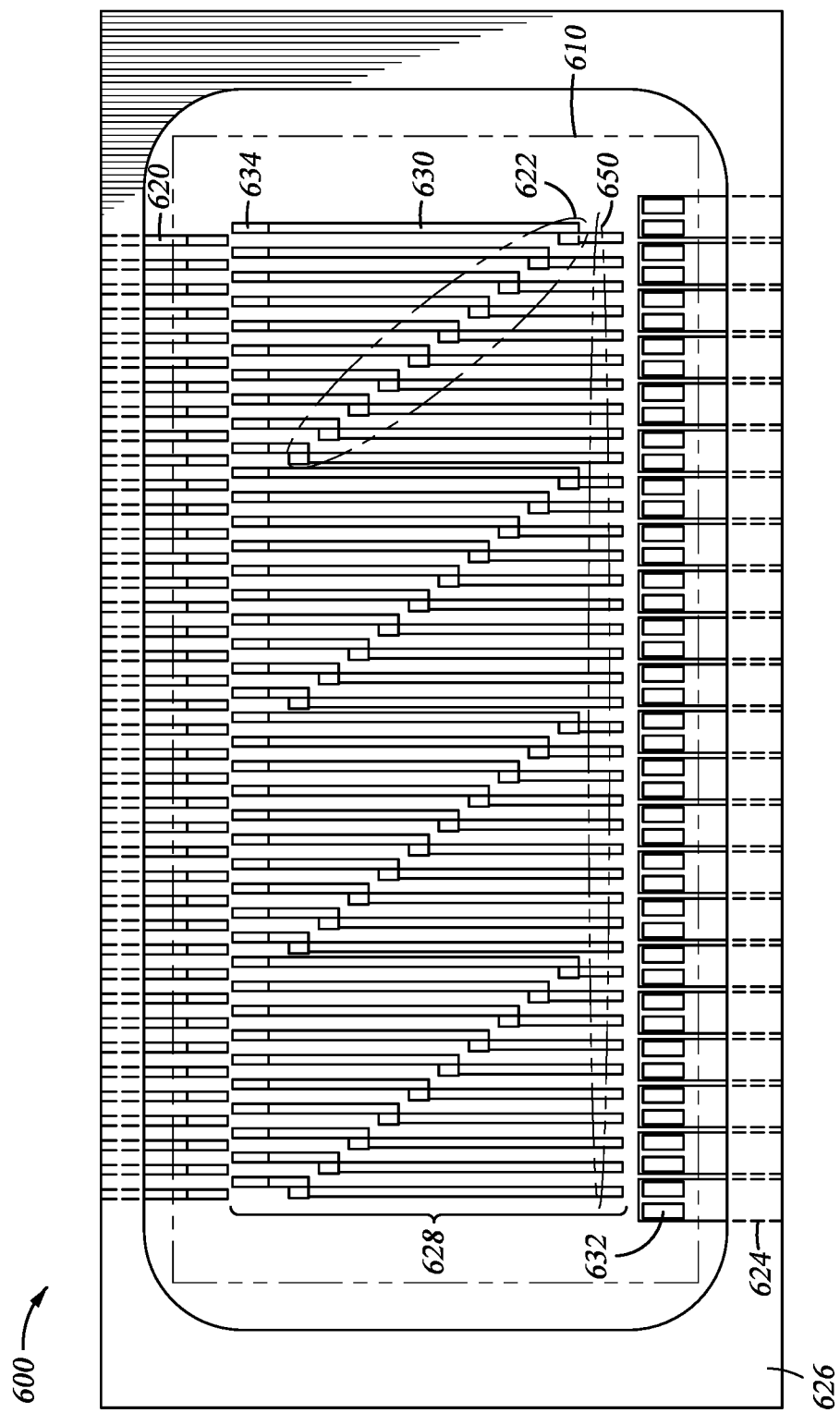
FIG. 6 illustrates a portion of a flexible connector, according to one or more embodiments.

FIG. 6 illustrates a portion of flexible connector 600 having an IC area 610 configured for mounting an IC chip (e.g., IC chip 510), according to one or more embodiments. In one embodiment, the flexible connector 600 is a 2L-COF (2-Layer Chip on Film) device and comprises COF (Chip on Film) wiring 620, through holes (THs) 622, COF wiring 624, solder resist (SR) area 626, wiring area 628, and COF wiring 630. In one embodiment, the COF wiring 620 and 624 are top leads. The THs 622 couple the COF wiring 630 to bottom leads 722 illustrated in FIG. 7. In another embodiment, the flexible connector 600 may be a 1L-COF (1-Layer Chip on Film) device.

The pitch of the THs 622 may differ from than that of the output pads 634. For example, the pitch of the THs 622 may be larger than the pitch of the output pads 634. Accordingly, the THs 622 may be disposed offset from one another to align the THs 622 with the output pads 634.

An IC chip (e.g., IC chip 510 of FIG. 5) may be mounted to the flexible connector 600 via the THs 622 within IC area 610. The IC area 610 may correspond to an open area of the solder resist area 626. The solder resist area 626 comprises a solder resist material configured to mitigate oxidation of traces and/or unintended connections between solder pads. The IC chip 510 may couple to include input pads 632 and output pads 634 within the IC area 610. In one embodiment, the output pads 634 are disposed along a first side of IC area 610, and the input pads 632 are disposed along a second side of the IC area 610. The input pads 632 and the output pad 634 may be referred to as bumps.

In embodiments where the IC chip 510 is a DDIC chip or a TDDI chip, the output pads 634 may be configured to output display update signals (subpixel data signals) driven by the IC chip 510 onto one or more display electrodes (e.g., source electrodes 530 of FIG. 5) of a display device (e.g., the display device 501 of FIG. 5). Further, the input pads 632 may receive data signals from a host device and couple the data signals to input pads on the IC chip 510. The data signals may be processed by the IC chip 510 to produce the subpixel data signals. Further, in one embodiment, the IC chip 510 may drive one or sensor electrodes (e.g., the sensor electrodes 405) of the input device 500 for capacitive sensing. For example, the IC chip 510 may drive one or more of the sensor electrodes for absolute capacitive sensing and/or absolute capacitive sensing.

In one or more embodiments, the flexible connector 600 includes wiring 650. The wiring 650 may be utilized to increase the rigidity (i.e., strength or stiffness) of the flexible connector 600 in the IC area 610. The wiring 650 includes one or more wires and may not be part of any electrical circuits, e.g., electrically floating. For example, the wires of the wiring 650 may not couple any electrical devices together and may not carry current between two or more electrical devices. Further, the wires of the wiring 650 may be isolated from the wires of the wiring 630, the through holes 622, and the input pads 632. In such embodiments, the wiring 650 may be referred to as dummy wiring as it isn't part of an electrical circuit. In one embodiment, the wiring 650 is an extension of the COF wiring 630. In other embodiments, the wiring 650 is separate from the COF wiring 630. Further, the wiring 650 may be referred to as a rigidity element as the wiring 650 increases the rigidity of the flexible connector 600 in the IC area 610.

The wiring 650 may increase the rigidity of the flexible connector 600 in the IC area 610. Increasing the rigidity of the flexible connector 600 in the IC area 610 by adding the wiring 650 may be referred to as increasing the uniformity of the rigidity of the IC area 610. In various embodiments, mounting the IC chip 510 to the flexible connector 600 may be completed utilizing a crimping or similar process.

Figure 2:
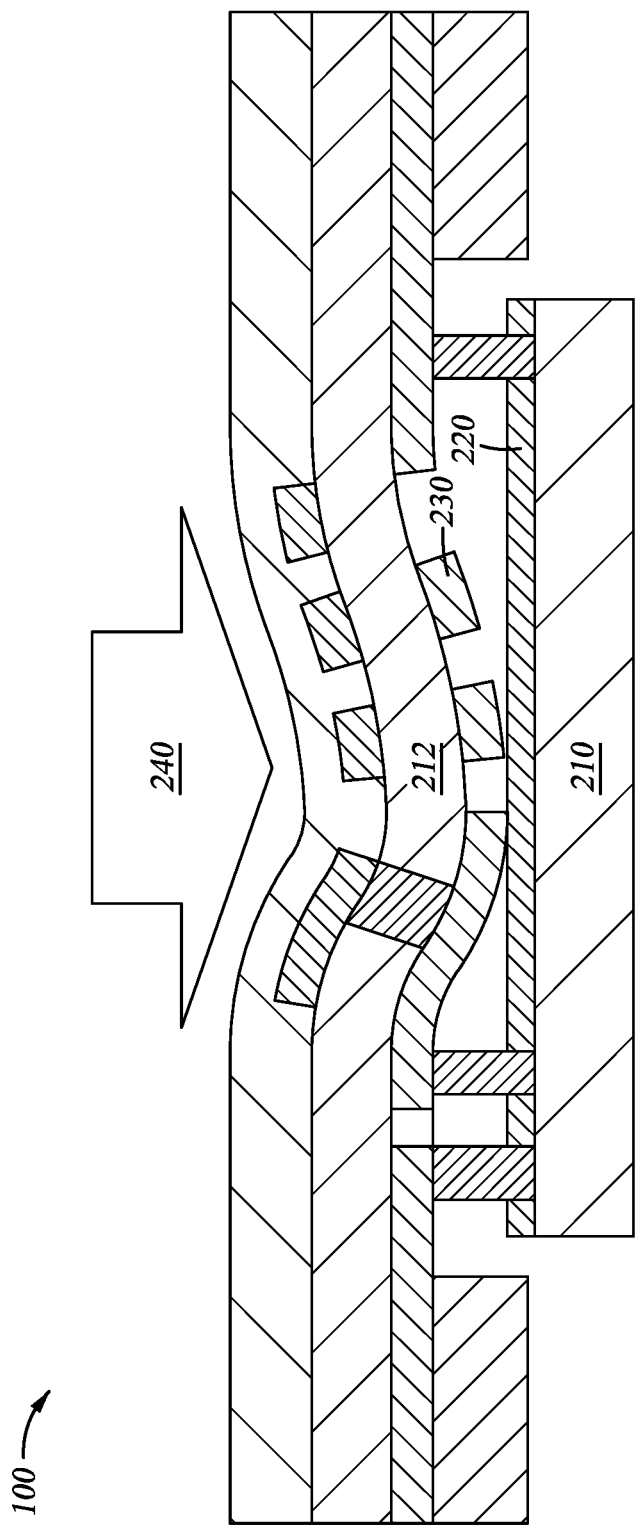
FIG. 2 is a cross-section of a conventional flexible connector.
Figure 7:
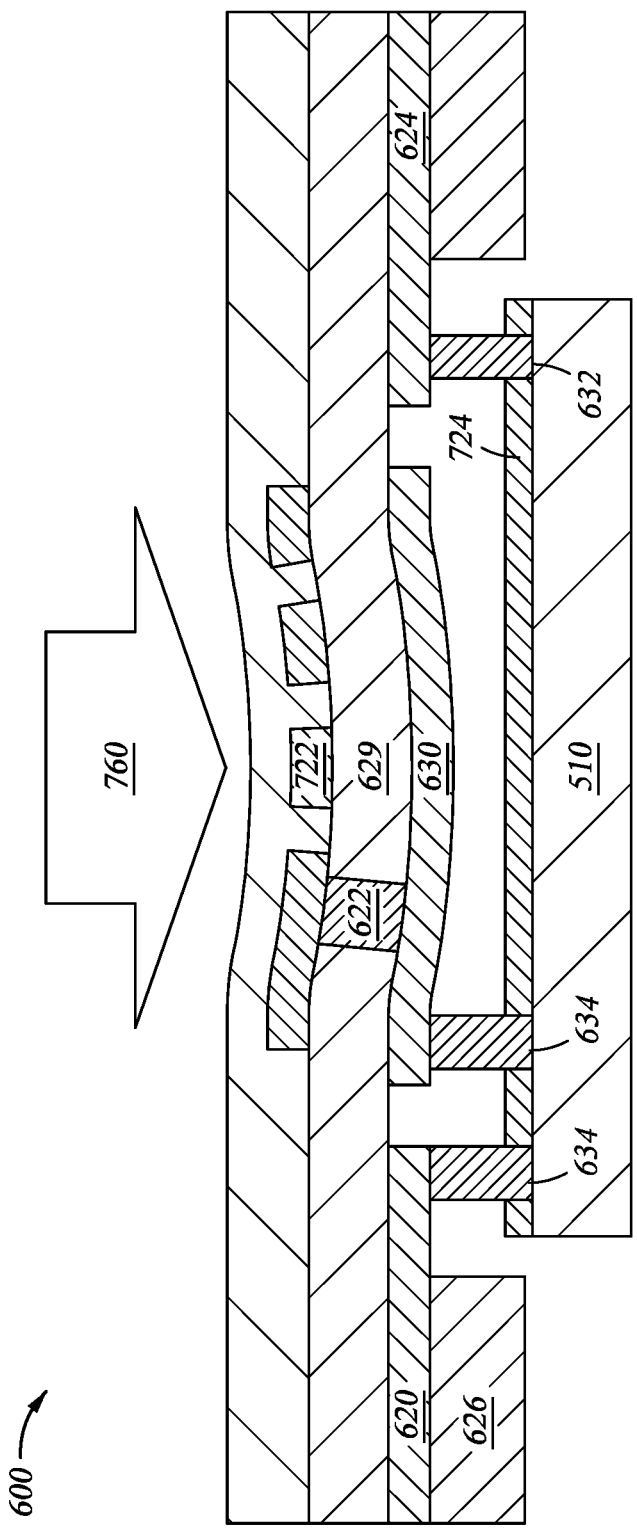
FIG. 7 is a cross-section of a flexible connector, according to one or more embodiments.

As shown by FIG. 7, the amount the flexible connector 600 bends or warps in response to bonding force 760 is less than that of the flexible connector not including the wiring 650 (e.g., the flexible connector 100 of FIG. 2) in response to a corresponding bonding force. Further, reducing the amount the flexible connector 600 bends or warps decreases the probability that the flexible connector 600 will experience a failure. For example, reducing the amount the flexible connector 600 bends or warps decreases the probability that the passivation layer 724 of the IC chip 510 will be cracked and/or the COF wiring 630 will be experience an electrical connection failure. During the assembly process, conductive foreign material may be trapped between the flexible connector 600 and the IC chip 510. As the flexible connector 600 bends, the COF wiring 630 may electrically couple to the IC chip 510 via the conductive foreign material. Thus, by reducing the amount at which the flexible connector 600 bends during assembly, the likelihood that the conductive foreign material forms electrical connection (e.g., electrical short) between the COF wiring 630 and the IC chip 510 is diminished. Further, increasing the rigidity of the flexible connector 600 may also beneficially increase the rigidity of a tape layer 629 of the flexible connector 600.

Additionally, a sealing material (e.g., under-fill) may be uniformly disposed on the IC chip 510, between the IC chip 510 and the flexible connector 600. The sealing member may reduce the probability that the IC chip 510 will electrically couple to conductive foreign matter that may be trapped between the flexible connector 600 and the IC chip 510.

The wiring 650 and the COF wiring 630 may be comprised of similar materials. For example, the wiring 650 may be patterned from the same material as the COF wiring 630. Alternatively, the wiring 650 is patterned from a material different than that of the COF wiring 630. Further, the wiring 650 may be electrically connected to THs 622 or electrically isolated from the THs 622. In one embodiment, the wiring 650 is disposed between THs 622 and input pads 632. Further, the distance between the wiring 650 and the THs 622 and/or the input pads 632 may be selected such that the wiring 650 is electrically isolated from the THs 622 and/or the input pads 632. Further, the wiring 650 may be evenly arranged in the portion of the wiring area 628 between the THs 622 and the input pads 632, such that the rigidity of the IC area 610 is uniform. In one or more embodiments, the wiring 650 may unevenly arranged within the portion of the wiring area 628 between the THs 622 and the input pads 632. In various embodiments, the wiring 650 may comprise a plurality of wires, where each wire corresponds to a wire of COF wiring 630. In other embodiments, the wiring 650 may comprise less wires that that of the COF wiring 630. For example, the number of wires within the wiring 650 may be at least about 50 percent of the number of wires within the COF wiring 630. Stated another way, at least about 50 percent of the wires of the COF wiring 630 correspond to a wire within the wiring 650. In another embodiment, the number of wires within the wiring 650 may be at least about 30 percent of the number of wires within the COF wiring 630. Stated another way, at least about 30 percent of the wires of the COF wiring 630 correspond to a wire within the wiring 650. Further, in one or more embodiments, the wiring 650 may have more wires that that of the COF wiring 630. In one embodiment, the wires of the wiring 650 may be at least partially disposed between the THs 622 and the output pads 634.

With reference to FIG. 5, the flexible connector 502 is configured similar to that of the flexible connector 600. For example, the flexible connector 502 may include wiring 650 to increase the rigidity of the IC area of the flexible connector 502, reducing failures that may occur while bonding the IC chip 510 to the flexible connector 502.

Figure 8:
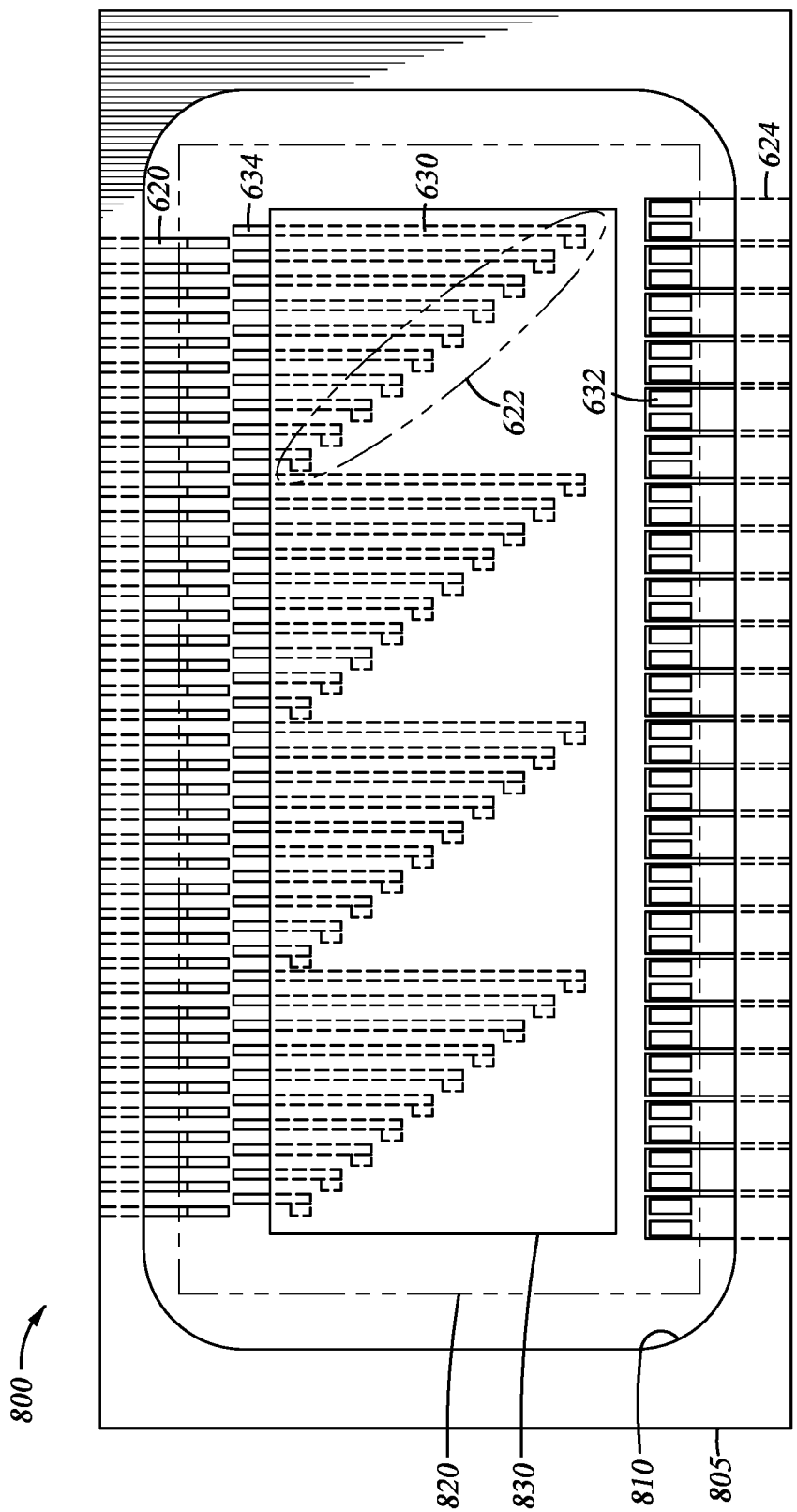
FIG. 8 illustrates a portion of a flexible connector, according to one or more embodiments.

FIG. 8 illustrates an additional embodiment for reducing failures when mounting an IC chip (e.g., the IC chip 510) to a flexible connector 800, according to one or more embodiments. For example, FIG. 8 illustrates a portion of flexible connector 800 corresponding to where an IC chip (e.g., the IC chip 510) may be mounted to the flexible connector 800. The flexible connector 800 includes a solder resist area 805, a solder resist open area 810, an IC area 820, and a solder resist remaining area 830. The solder resist open area 810 corresponds to an area of the flexible connector 800 that is free from solder resist material, the IC area 820 corresponds to an area of the flexible connector 800 to which an IC chip is mounted, and the remaining solder resist area 830 corresponds to an area of the flexible connector 800 that includes solder resist material. As the solder resist remaining area 830 increases the rigidity of the flexible connector 800, the solder resist remaining area 830 may be referred to as a rigidity element.

As compared to the flexible connector 100, the flexible connector 800 includes an additional solder resist remaining area (e.g., the solder resist remaining area 830) within the IC area 820. Stated another way, while in the embodiment of FIG. 1, the IC area 110 of the flexible connector 100 is free from solder resist, in the embodiment of FIG. 8, the IC area 820 includes the area with solder resist, (e.g., the solder resist remaining area 830).

In one embodiment, the solder resist of the solder resist remaining area 830 is disposed in the IC area 820 such that the solder resist is at least partially disposed between the THs 622 and the input pads 632. At least partially disposing the solder resist of the solder resist remaining area 830 between the THs 622 and the input pads 632 includes disposing the solder resist over each of the THs 622. Further, at least partially disposing the solder resist of the solder resist remaining area 830 includes disposing the solder resist such that the solder resist is between the output pads 634 and the input pads 632 and overlaps the THs 622 and at least a portion of the wiring 630. In such an embodiment, the solder resist of the solder resist remaining area 830 is disposed over the THs 622, between the THs 622 and an IC chip (e.g., the IC chip 510), and between at least a portion of the COF wiring 630 and the IC chip. In other embodiments, the solder resist of the solder resist remaining area 830 is disposed over the THs 622 and the entirety of the COF wiring 630. Further, in embodiments where the solder resist remaining area 830 spans from the output pads 634 to the input pads 632, the solder resist of the solder resist remaining area 830 may or may not overlap at least a portion of the output pads 634 and/or the input pads 632. For example, in one embodiment, the solder resist of the solder resist remaining area 830 is not disposed over the output pads 634 and/or the input pads 632. In such an embodiment, the solder resist of the solder resist remaining area 830 is disposed within the IC area 820 and between the output pads 634 and the input pads 632 without overlapping either of the output pads 634 and the input pads 632. In another embodiment, the solder resist of the solder resist remaining area 830 is disposed within the IC area 820 and overlaps at least a portion of or the entirety of the output pads 634 and/or the input pads 632.

In one or more embodiments, the solder resist remaining area 830 is smaller than the IC area 820. For example, the size of the solder resist remaining area 830 may correspond to the bonding area of the IC area 820 and account for customary manufacturing tolerances. In one embodiment, the bonding area may correspond to an area where the flexible connector 800 is electrically coupled to an IC chip, and the tolerances may correspond to at least one of a solder resist patterning size tolerance and an overlay tolerance. By limiting the solder resist remaining area 830 to be at least less than the size of the bonding area of the IC area 820, bonding peeling may be reduced or avoided. Further, by covering each of the THs 622 with the solder resist of the solder resist remaining area 830, electrically shorting of the THs 622 may be reduced or avoided.

In one or more embodiments, the flexible connector 800 may include one or more remaining solder resist areas 830 each comprising solder resist to increase the rigidity, i.e., strength, of the flexible connector 800. In one embodiment, the flexible connector 800 may include two or more remaining solder resist areas 830. For example, a first remaining solder resist area 830 may be disposed over a first portion of the IC area 820 and a second remaining solder resist area 830 may be disposed over a second portion of the IC area 820. Each of the remaining solder resist areas 830 may be disposed over the same amount of the IC area 820 or one of the remaining solder resist area 830 may be disposed over a larger percentage of the IC area 820 than the another one of the remaining solder resist areas 830. In one embodiment, a first remaining solder resist area 830 is disposed over a first portion of the THs 622 and the COF wiring 630 and a second remaining solder resist area 830 is disposed over a second portion of the THs 622 and the COF wiring 630.

Figure 9:
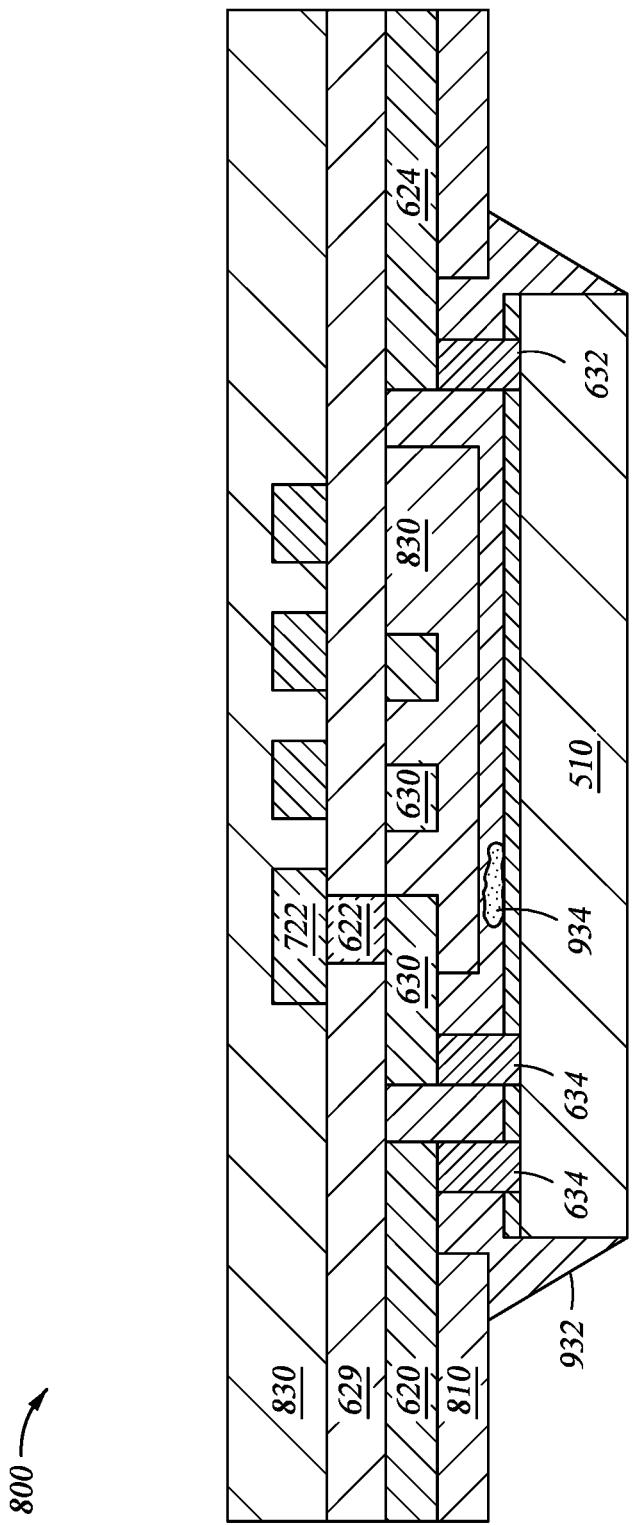
FIG. 9 is a cross-section of a flexible connector, according to one or more embodiments.

FIG. 9 illustrates a cross-section of IC area 820 of the flexible connector 800, according to one or more embodiments. In the embodiment of FIG. 9, the IC chip 510 is mounted to the flexible connector 800 within the IC area 820. In one embodiment, during the mounting process, metal foreign material 934 may become trapped between the IC chip 510 and the flexible connector 800. The metal foreign material 934 may be any conductive foreign material. As shown in FIG. 9, the solder resist material of the solder resist remaining area 830, may function to electrically isolate the metal foreign material 934 from the COF wiring 630, thus preventing the metal foreign material 934 from electrically coupling (e.g., electively shorting) the IC chip 510 to the COF wiring 630. Stated another way, the solder resist material of the solder resist remaining area 830 may insulate a least a portion of the COF wiring 630 from the IC chip 510.

As is stated above, when the bonding force 760 is applied to the flexible connector 800 for mounting of the IC chip 510, the flexible connector 800 may experience bending or warping. In response to the bending or warping of the flexible connector 800, the COF wiring 630 may move closer to the IC chip 510. As is show by the embodiment FIG. 9, the COF wiring 630 is beneficially insulated by the solder resist material of the solder resist remaining area 830, which prevents the COF wiring 630 from electrically coupling to the IC chip 510 in response to warping or bending of the flexible connector 800.

As shown in FIG. 9, the input pads 632 are coupled the COF wiring 624 and the output pads 634 are coupled to the COF wiring 620 and 630. The input pads 632 and the output pads 634 may be referred to as bumps. Further, under-fill 932 may be disposed between the IC chip 510 and the flexible connector 800. The under-fill 932 may aid in avoiding moisture from diffusing between the IC chip 510 and the flexible connector 800. A distance defined between the IC chip 510 and the flexible connector 800 defines a gap in which under-fill 932 may be disposed. In one embodiment, the distance between the solder resist of the solder resist remaining area 830 and the IC chip 510 is between about 0.1 μm to about 20 μm. In other embodiments, a distance of greater than about 20 μm may be utilized and a distance of less than about 0.1 μm may be utilized. Larger distances allow for higher bump heights of the input pads 632 and the output pads 634 of the IC chip 510 to be utilized, which may increase the effectiveness of the bumps the input pads 632 and the output pads 634 when mounting the IC chip 510 to the flexible connector 800. For example, higher bump heights may make it easier to electrically couple the IC chip 510 to the flexible connector 800.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

What is claimed is:

1. A flexible connector, comprising:
a first plurality of pads disposed within an integrated circuit (IC) area;
a second plurality of pads disposed in the IC area;
a plurality of through holes disposed in the IC area;
first wiring coupled to the plurality of through holes and the first plurality of pads; and
a rigidity element at least partially disposed between the plurality of through holes and the second plurality of pads,
wherein the rigidity element is configured to increase a rigidity of the flexible connector, and
wherein the rigidity element comprises a plurality of wires arranged in a pattern of monotonically increasing length of the plurality of wires.

2. The flexible connector of claim 1, wherein the plurality of wires is at least partially disposed between the plurality of through holes and the second plurality of pads.

3. The flexible connector of claim 2, wherein the plurality of wires is isolated from the first wiring, the plurality of through holes, and the second plurality of pads.

4. The flexible connector of claim 2, wherein the plurality of wires and the first wiring are comprised of a common material.

5. The flexible connector of claim 1, wherein the rigidity element comprises solder resist.

6. The flexible connector of claim 5, wherein the solder resist is at least partially disposed over at least one of the plurality of through holes and the first wiring.

7. The flexible connector of claim 1 further comprising two or more layers.

8. A display device, comprising:
a substrate;
a plurality of display electrodes disposed on the substrate;
a flexible connector connected to the substrate and comprising:
a first plurality of pads disposed within an integrated circuit (IC) area of the flexible connector;
a second plurality of pads disposed in the IC area;
a plurality of through holes disposed in the IC area;
first wiring coupled to the plurality of through holes and the first plurality of pads; and
a rigidity element at least partially disposed between the plurality of through holes and the second plurality of pads,
wherein the rigidity element is configured to increase a rigidity of the flexible connector, and
wherein the rigidity element comprises a plurality of wires arranged in a pattern of monotonically increasing length of the plurality of wires; and
an IC chip coupled to the plurality of through holes within the IC area, wherein the IC chip is configured to drive the plurality of display electrodes to update a display of the display device.

9. The display device of claim 8, wherein the plurality of wires is at least partially disposed between the plurality of through holes and the second plurality of pads.

10. The display device of claim 9, wherein the plurality of wires is isolated from the first wiring, the plurality of through holes, and the second plurality of pads.

11. The display device of claim 9, wherein the plurality of wires and the first wiring are comprised of a common material.

12. The display device of claim 8, wherein the rigidity element comprises solder resist.

13. The display device of claim 12, wherein the solder resist is at least partially disposed over at least one of the plurality of through holes and the first wiring.

14. The display device of claim 8, wherein the flexible connector further comprises two or more layers.

15. An input device, comprising:
- a flexible connector comprising:
  - a first plurality of pads disposed within an integrated circuit (IC) area of the flexible connector;
  - a second plurality of pads disposed in the IC area;
  - a plurality of through holes disposed in the IC area;
  - first wiring coupled to the plurality of through holes and the first plurality of pads; and
  - a rigidity element at least partially disposed between the plurality of through holes and the second plurality of pads,
  - wherein the rigidity element is configured to increase a rigidity of the flexible connector, and
  - wherein the rigidity element comprises a plurality of wires arranged in a pattern of monotonically increasing length of the plurality of wires; and
- an IC chip coupled to the through holes of the flexible connector within the IC area.

16. The input device of claim 15, wherein the plurality of wires is at least partially disposed between the plurality of through holes and the second plurality of pads.

17. The input device of claim 16, wherein the plurality of wires is isolated from the first wiring, the plurality of through holes, and the second plurality of pads.

18. The input device of claim 16, wherein the plurality of wires the first wiring are comprised of a common material.

19. The input device of claim 18, wherein the rigidity element comprises solder resist at least partially disposed over at least one of the plurality of through holes and the first wiring.

20. The input device of claim 15, wherein the flexible connector further comprises two or more layers.

* * * * *

UNITED STATES PATENT AND TRADEMARK OFFICE
CERTIFICATE OF CORRECTION

PATENT NO. : 11,259,406 B2
APPLICATION NO. : 16/689805
DATED : February 22, 2022
INVENTOR(S) : Shinya Suzuki et al.

It is certified that error appears in the above-identified patent and that said Letters Patent is hereby corrected as shown below:

In the Claims

Column 19, Claim 18, Line 26, the words "wires the first wiring are...." should read -- wires and the first wiring are .... --.

Signed and Sealed this
Twenty-fourth Day of May, 2022

Katherine Kelly Vidal
*Director of the United States Patent and Trademark Office*